(12) United States Patent
Lansalot-Matras

(10) Patent No.: US 9,099,301 B1
(45) Date of Patent: Aug. 4, 2015

(54) PREPARATION OF LANTHANUM-CONTAINING PRECURSORS AND DEPOSITION OF LANTHANUM-CONTAINING FILMS

(71) Applicant: L'Air Liquide, Société Anonyme pour l'Etude et l'Exploitation des Procédés Georges Claude, Paris (FR)

(72) Inventor: Clément Lansalot-Matras, Seoul (KR)

(73) Assignee: L'Air Liquide, Société Anonyme pour l'Etude et l'Exploitation des Procédés Georges Claude, Paris (FR)

(*) Notice: Subject to any disclaimer, the term of this patent is extended or adjusted under 35 U.S.C. 154(b) by 0 days.

(21) Appl. No.: 14/132,845

(22) Filed: Dec. 18, 2013

(51) Int. Cl.
H01L 21/469 (2006.01)
H01L 21/02 (2006.01)

(52) U.S. Cl.
CPC .... *H01L 21/02192* (2013.01); *H01L 21/02205* (2013.01); *H01L 21/02271* (2013.01)

(58) Field of Classification Search
USPC ........................................................ 438/790
See application file for complete search history.

(56) References Cited

U.S. PATENT DOCUMENTS

| 5,453,494 | A | 9/1995 | Kirlin et al. |
| 7,396,949 | B2 | 7/2008 | Denk et al. |
| 2006/0024443 | A1 | 2/2006 | Sakai et al. |
| 2006/0046521 | A1 | 3/2006 | Vaartstra et al. |
| 2006/0141155 | A1* | 6/2006 | Gordon et al. ........... 427/255.19 |
| 2008/0102205 | A1 | 5/2008 | Barry et al. |
| 2008/0305260 | A1 | 12/2008 | Shenai-Khatkhate et al. |
| 2009/0302434 | A1 | 12/2009 | Pallem et al. |
| 2012/0156373 | A1 | 6/2012 | Pallem et al. |
| 2014/0051878 | A1* | 2/2014 | Sundermeyer et al. ......... 556/43 |

FOREIGN PATENT DOCUMENTS

| JP | 2006 37161 | 2/2006 |
| JP | 2006 511716 | 4/2006 |
| WO | WO 2004 046417 | 6/2004 |
| WO | WO 2006 012052 | 2/2006 |

(Continued)

OTHER PUBLICATIONS

Baunemann, Arne, et al., "Tantalum complexes with all nitrogen coordination sphere; mixed amido-, imido-, guanidinato complexes of tantalum and their thermal behaviour," The Royal Society of Chemistry, Dalton Trans., 2005, p. 3051-3055.

(Continued)

*Primary Examiner* — Asok K Sarkar
(74) *Attorney, Agent, or Firm* — Patricia E. McQueeney

(57) ABSTRACT

Methods and compositions for depositing La-containing layers are described herein. In general, the disclosed methods deposit the precursor compounds comprising rare earth-containing compounds using deposition methods such as chemical vapor deposition or atomic layer deposition. The disclosed precursor compounds include a cyclopentadienyl ligand having at least one aliphatic group as a substituent and an amidine ligand.

17 Claims, 2 Drawing Sheets

(56) References Cited

FOREIGN PATENT DOCUMENTS

| WO | WO 2008 088563 | 7/2008 |
|---|---|---|
| WO | WO 2009 149372 | 12/2009 |

OTHER PUBLICATIONS

Elliott, S.D. "Improving ALD growth rate via ligand basicity: Quantum chemical calculations on lanthanum precursors". Surface and Coatings Technology, Elsevier, Amsterdam, NL, vol. 201, No. 22-23, Aug. 9, 2007, pp. 9076-9081: pp. 9079-9080.

Päiväsaari, J. et al. "A comparative study of lanthanide oxide thin films grown by atomic layer deposition". Thin Solid Films, vol. 472, 2005, pp. 275-281: abstract.

Pi, C. et al. "Multiple N-H bond activation: Synthesis and reactivity of functionalized primary amido ytterbium complexes". Organometallics, vol. 26, 2007, pp. 1934-1946: p. 1944.

Rao V.P. et al., Development of lanthanides precursors as dopants for advanced high-k materials Abstract, $218^{th}$ ECS Meeting, 2010 Electrochemical Society, Las Vegas, Nevada.

Zhang, J. et al., "Insertion of carbodiimide into the Ln-C σ-bond of organolanthanide complexes. Synthesis, reaction, and characterization of organolanthanide amidinates $(C_5H_5)_2Ln[^tBuN—C(N^tBu)—N^tBu]$ (Ln = Er, Gd, Y)," Organometallics 2002, 21, pp. 1420-1424.

International Search Report and Written Opinion for PCT/US2009/046443, Oct. 23, 2009.

\* cited by examiner

PREPARATION OF LANTHANUM-CONTAINING PRECURSORS AND DEPOSITION OF LANTHANUM-CONTAINING FILMS

BACKGROUND

One of the challenges the industry faces is developing new gate dielectric materials for Dynamic Random Access Memory (DRAM) and capacitors. For decades, silicon dioxide ($SiO_2$) was a reliable dielectric, but as transistors have continued to shrink and the technology moved from "Full Si" transistor to "Metal Gate/High-k" transistors, the reliability of the $SiO_2$-based gate dielectric is reaching its physical limits. The need for new high dielectric constant material and processes is increasing and becoming more and more critical as the size for current technology is shrinking. New generations of oxides especially based on Lanthanum-containing materials are thought to give significant advantages in capacitance compared to conventional dielectric materials.

Nevertheless, deposition of Lanthanum-containing layers is difficult and new material and processes are increasingly needed. For instance, atomic layer deposition (ALD) has been identified as an important thin film growth technique for microelectronics manufacturing, relying on sequential and saturating surface reactions of alternatively applied precursors, separated by inert gas purging. The surface-controlled nature of ALD enables the growth of thin films having high conformality and uniformity with an accurate thickness control. The need to develop new ALD processes for rare earth materials is obvious.

Unfortunately, the successful integration of compounds into deposition processes has proven to be difficult. Three classes of molecules are typically proposed in the case of Lanthanum: beta-diketonates, bis(trimethylsilyl)amide and cyclopentadienyls. The two first families of compounds are stable, but the melting points may exceed 90° C., making them impractical. Lanthanum 2,2-6,6-tetramethylheptanedionate's [$La(tmhd)_3$] melting point is as high as 230° C., and the Lanthanum tris(bis(trimethylsilyl)amido) [$La(tmsa)_3$] melting point is 150° C. Additionally, the delivery efficiency of those precursors is very difficult to control. Non-substituted cyclopentadienyl compounds also exhibit low volatility with a high melting point. Molecule design may both help improve volatility and reduce the melting point. However, in process conditions, these classes of materials have been proven to have limited use. For instance, $La(iPrCp)_3$ does not allow an ALD regime above 225° C.

Commonly owned PCT Patent Application Publication No. WO 2009/149372 discloses rare earth metal precursors containing cyclopentadienyl and amidinate ligands. However, the examples reveal that synthesis of $La(EtCp)_2(N^{iPr}$-amd), $La(EtCp)(N^{iPr}$-amd$)_2$, $La(iPrCp)_2(N^{iPr}$-amd), and $La(iPrCp)(N^{iPr}$-amd$)_2$ failed.

Some of the Lanthanum-containing precursors currently available present many drawbacks when used in a deposition process. Consequently, there exists a need for alternate precursors for deposition of Lanthanum-containing films.

SUMMARY

Disclosed herein are Lanthanum-containing precursors of the general formula:

$$La(R^1Cp)_m(R^2-N-C(R^3)=N-R^2)_n,$$

wherein:
- $R^1$ being selected from the group consisting of H and a C1-C5 alkyl chain;
- $R^1$ being H;
- $R^1$ being selected from the group consisting of Me, Et, and iPr;
- $R^1$ being Me;
- $R^1$ being Et;
- $R^1$ being iPr;
- $R^2$ being selected from the group consisting of H and a C1-C5 alkyl chain;
- $R^2$ being selected from the group consisting of iPr and tBu;
- $R^2$ being iPr;
- $R^2$ being tBu;
- $R^3$ being selected from the group consisting of H and Me;
- $R^3$ being H;
- $R^3$ being Me;
- n and m ranging from 1 to 2;
- n being 1;
- m being 2;
- n being 2;
- m being 1;
- the precursor having a melting point below approximately 105° C.; and
- the precursor being $La(iPrCp)_2(iPr-N-C(Me)=N-iPr)$.

Also disclosed are methods for depositing Lanthanum-containing films on semiconductor substrates. The Lanthanum-containing precursors disclosed above are introduced into a reactor having a substrate disposed therein. At least part of the Lanthanum-containing precursor is deposited onto the substrate to form the Lanthanum-containing film on the substrate using a vapor deposition process. The disclosed method may optionally include one or more of the following aspects:
- depositing the Lanthanum-containing film on the substrate at a temperature between about 150° C. and about 600° C.;
- depositing the Lanthanum-containing film on the substrate at a pressure between about 0.5 mTorr and about 20 Torr;
- the substrate being a $GeO_2$ film;
- the substrate being a high k gate dielectric film;
- the Lanthanum-containing precursor being a liquid at a temperature below 70° C.;
- the Lanthanum-containing precursor being a liquid at a temperature below 40° C.;
- the Lanthanum-containing film being selected from the group consisting of $La_2O_3$, $(LaLn)O_3$, $La_2O_3$-$Ln_2O_3$, $LaSi_xO_y$, $LaGe_xO_y$, (Al, Ga, Mn)$LaO_3$, $HfLaO_x$, and $ZrLaO_x$, $LaSrCoO_4$, $LaSrMnO_4$, wherein Ln is a different Lanthanide and x and y are each a number selected from 1-5 inclusive;
- the Lanthanum-containing film being $HfLaO_x$ or $ZrLaO_x$, wherein x is a number selected from 1-5 inclusive;
- the Lanthanum-containing precursor having the general formula selected from the group consisting of $La(R^1Cp)_2(N^Z$-fmd), $La(R^1Cp)_2(N^Z$-amd), $La(R^1Cp)(N^Z$-fmd$)_2$, and $La(R^1Cp)(N^Z$-amd$)_2$, wherein $R^1$ is selected from the group consisting of Me, Et, and iPr; and Z is iPr or tBu;
- the Lanthanum-containing precursor being $La(iPrCp)_2(iPr-N-C(Me)=N-iPr)$;
- annealing the Lanthanum-containing film.
- introducing a reactant species into the reactor;
- the reactant species being selected from the group consisting of $O_2$, $O_3$, $H_2O$, $H_2O_2$, acetic acid, formalin, paraformaldehyde, and combinations thereof;
- the reactant species being $O_3$;
- the reactant species being $H_2O$;

introducing the Lanthanum-containing precursor and the reactant species at least partially simultaneously, as in a chemical vapor deposition process;

introducing the Lanthanum-containing precursor and the reactant species sequentially, as in an atomic layer deposition process;

introducing a precursor into the reactor, wherein the precursor is different than the Lanthanum-containing precursor, and depositing at least part of the precursor to form the Lanthanum-containing layer on the one or more substrates;

the precursor containing an element selected from the group consisting of Hf, Si, Al, Ga, Mn, Ti, Ta, Bi, Zr, Pb, Nb, Mg, Sr, Y, Ba, Ca, a Lanthanide, and combinations thereof;

the precursor containing Ge;

the precursor containing Hf;

the vapor deposition process being a chemical vapor deposition process;

the vapor deposition process being an atomic layer deposition process;

the vapor deposition process being a spatial ALD process;

the vapor deposition process including a plasma process;

the vapor deposition process not including a plasma process; and the vapor deposition process being a thermal process.

Also disclosed are Lanthanum-containing film coated substrates comprising the product of the disclosed methods.

NOTATION AND NOMENCLATURE

Certain abbreviations, symbols, and terms are used throughout the following description and claims and include:

As used herein, the indefinite article "a" or "an" means one or more.

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1{}_x\%$ $(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

As used herein, the abbreviation "Ln" refers to the Lanthanide group, which includes the following elements: scandium ("Sc"), yttrium ("Y"), lutetium ("Lu"), lanthanum ("La"), cerium ("Ce"), praseodymium ("Pr"), neodymium ("Nd"), samarium ("Sm"), europium ("Eu"), gadolinium ("Gd"), terbium ("Tb"), dysprosium ("Dy"), holmium ("Ho"), erbium ("Er"), thulium ("Tm"), or ytterbium ("Yb"); the abbreviation "Cp" refers to cyclopentadienyl; the abbreviation "Å" refers to angstroms; prime ("'") is used to indicate a different component than the first, for example $(LnLn')O_3$ refers to a Lanthanide oxide containing two different Lanthanide elements; the term "aliphatic group" refers to a C1-C5 linear or branched chain alkyl group; the term "alkyl group" refers to saturated functional groups containing exclusively carbon and hydrogen atoms; the abbreviation "Me" refers to a methyl group; the abbreviation "Et" refers to an ethyl group; the abbreviation "Pr" refers to a propyl group; the abbreviation "iPr" refers to an isopropyl group; the abbreviation "tBu" refers to a tertiary butyl group, the abbreviation "$N^Z$-amd" refers to the amidinate ligand [$ZNC(CH_3)$=NZ], wherein Z is a defined alkyl group such as iPr or tBu; the abbreviation "$N^Z$-fmd" refers to the formidinate ligand [ZNC(H)=NZ], wherein Z is a defined alkyl group such as iPr or tBu; the abbreviation "CVD" refers to chemical vapor deposition; the abbreviation "LPCVD" refers to low pressure chemical vapor deposition; the abbreviation "ALD" refers to atomic layer deposition; the abbreviation "P-CVD" refers to pulsed chemical vapor deposition; the abbreviation "PE-ALD" refers to plasma enhanced atomic layer deposition; the abbreviation "MIM" refers to Metal Insulator Metal (a structure used in capacitors); the abbreviation "DRAM" refers to dynamic random access memory; the abbreviation "FeRAM" refers to ferroelectric random access memory; the abbreviation "CMOS" refers to complementary metal-oxide-semiconductor; the abbreviation "THF" refers to tetrahydrofuran; the abbreviation "TGA" refers to thermogravimetric analysis; the abbreviation "TMA" refers to trimethyl aluminum; the abbreviation "TBTDET" refers to tertiary butylimido, tris(diethylamino) tantalum ($Ta[N(C_2H_5)_2]_3[NC(CH_3)_3]$); the abbreviation "TAT-DMAE" refers to tantalum tetraethoxide dimethylaminoethoxide; the abbreviation "PET" refers to pentaethoxy tantalum; the abbreviation "TBTDEN" refers to tertiary butylimido, tris(diethylamino) niobium; the abbreviation "PEN" refers to pentaethoxy niobium; the abbreviation "TriDMAS" refers to tris(dimethylamino) silane [$SiH(NMe_2)_3$]; the abbreviation "BDMAS" refers to bis(dimethylamino) silane; the abbreviation "BDEAS" refers to bis(diethylamino) silane [$SiH_2(NEt_2)_2$]; the abbreviation "TDEAS" refers to tetrakis-diethylamino silane; the abbreviation "TDMAS" refers to tris(dimethylamino) silane; the abbreviation "TEMAS" refers to tetrakis-ethylmethylamino silane ($Si(N(C_2H_5)(CH_3))_4$); the abbreviation "BTBAS" refers to bis(tert-butylamino)silane [$SiH_2(NHtBu)_2$].

The standard abbreviations of the elements from the periodic table of elements are used herein. It should be understood that elements may be referred to by these abbreviations (e.g., La refers to Lanthanum, N refers to nitrogen, O refers to oxygen, C refers to carbon, etc.).

BRIEF DESCRIPTION OF THE DRAWINGS

For a further understanding of the nature and objects of the present invention, reference should be made to the following detailed description, taken in conjunction with the accompanying drawings, wherein.

DESCRIPTION OF PREFERRED EMBODIMENTS

Figure 1:
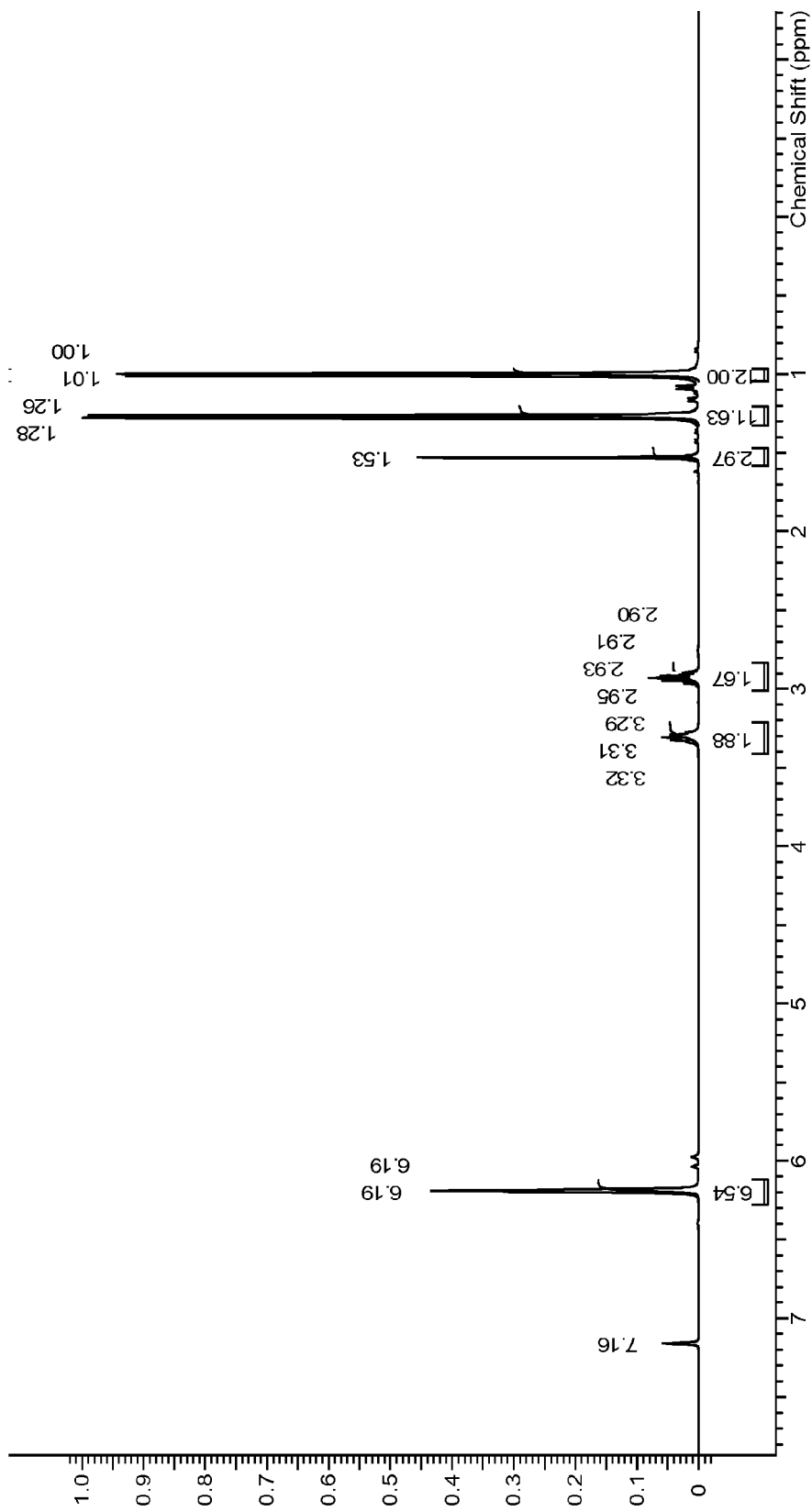
FIG. 1 is a Nuclear Magnetic Resonance (NMR) graph illustrating the chemical shift of the hydrogens in $La(iPrCp)_2(N^{iPr}\text{-amd})$.

Disclosed are Lanthanum-containing precursors having the general formula:

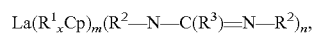

wherein each $R^1$ is independently selected from H or a C1-C5 alkyl chain; x is 0-5 inclusive, preferably 1-5 inclusive; $R^2$ is selected from H or a C1-C5 alkyl chain; $R^3$ is selected from H or a C1-C5 alkyl chain; m is selected from 1 or 2; and n is selected from 1 or 2.

The Lanthanum-containing precursors offer unique physical and chemical properties when compared to their corresponding homoleptic compounds, which include tris-substituted cyclopentadienyl Lanthanum compounds, $La(RCp)_3$, tris-acetamidinate compounds, $La(R—N—C(R')=N—R)_3$, or tris-formamidinate compounds, $La(R—N—C(H)=N—R)_3$. Such properties include better control of steric crowding around the metal center, which in turn controls the surface reaction on the substrate and the reaction with a second reactant (such as an oxygen source). Independently fine tuning the substituents on the ligands increases volatility and thermal stability and decreases melting point to yield either liquids or low melting solids (having a melting point below approximately 105° C.).

In order to synthesize stable Lanthanum-containing precursors with properties suited for the vapor deposition process (i.e., a volatile, yet thermally stable, liquid or low melting solid (having a melting point below about 105° C.)), a direct correlation between the properties of the central metal ion (coordination number) and ligands (steric effect, ratio of two heteroleptic ligands) has been observed. Preferably, the metal compound has a 3+ charge and coordination number of 6. Preferably $R^1$ is a C1-C3 alkyl chain; $R^2$ is a C3-C4 alkyl chain, $R^3$ is H or Me, m is 2 and n is 1. Preferably the Lanthanum-containing precursor has a melting point below about 105° C., preferably below about 80° C., more preferably below about 70° C., and even more preferably below about 40° C. Preferred Lanthanum-containing precursors include $La(R^1Cp)_2(N^Z\text{-fmd})$, $La(R^1Cp)_2(N^Z\text{-amd})$, $La(R^1Cp)(N^Z\text{-fmd})_2$, and $La(R^1Cp)(N^Z\text{-amd})_2$, wherein $R^1$ is Me, Et, or iPr; and Z is iPr or tBu.

The synthesis of the $La(R^1Cp)_m(R^2—N—C(R^4)=N—R^2)_n$ precursor (where m=2, n=1 or m=1, n=2) may be carried out by following methods:

$LaX_3(THF)_x$ (where X=Cl, Br, I and x=1 to 5) is prepared in advance by reacting pure $LaX_3$ (where X=Cl, Br, I) in anhydrous Tetrahydrofuran (THF). $LaX_3(THF)_x$ (where X=Cl, Br, I and x=1 to 5) is reacted with m equivalents of $R^1CpM$ (where M=Li, Na, K and m is selected from 1 to 2) followed by filtration, and reacting the filtrate with n equivalent of $M(R^2—N—C(R^3)=N—R^2)$ (where $R^2$ is selected from H or a C1-C5 alkyl chain; $R^3$ is selected from H or a C1-C5 alkyl chain and n selected from 1 to 2), to result in $La(R^1Cp)_m(R^2—N—C(R^3)=N—R^2)_n$ precursor (Scheme-1). More details are provided in the examples that follow.

Scheme-1

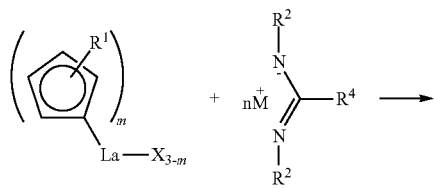

-continued

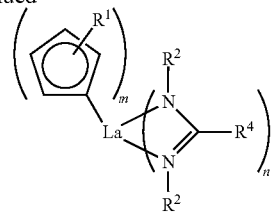

A portion of the disclosed precursor compounds (hereinafter the "Lanthanum-containing precursor") may be deposited to form Lanthanum-containing films using any vapor deposition methods known to those of skill in the art. Examples of suitable vapor deposition methods include without limitation, conventional chemical vapor deposition (CVD), atomic layer deposition (ALD), or other types of vapor depositions that are variations thereof, such as plasma enhanced ALD (PEALD), plasma enhanced CVD (PECVD), low pressure CVD (LPCVD), pulsed chemical vapor deposition (P-CVD), low pressure CVD (LPCVD), sub-atmospheric CVD (SACVD), atmospheric pressure CVD (APCVD), hot-wire CVD (HWCVD, also known as cat-CVD, in which a hot wire serves as an energy source for the deposition process), thermal ALD, thermal CVD, spatial ALD, hot-wire ALD (HWALD), radicals incorporated deposition, and super critical fluid deposition, or combinations thereof. The deposition method is preferably ALD, PE-ALD, or spatial ALD in order to provide suitable step coverage and film thickness control.

The type of substrate upon which the Lanthanum-containing film will be deposited will vary depending on the final use intended. In some embodiments, the substrate may be chosen from oxides which are used as dielectric materials in MIM, DRAM, FeRam technologies or gate dielectrics in CMOS technologies (for example, $HfO_2$ based materials, $TiO_2$ based materials, $GeO_2$ based materials, $ZrO_2$ based materials, rare earth oxide based materials, ternary oxide based materials, etc.) or from nitride-based films (for example, TaN) that are used as an oxygen barrier between copper and the low-k layer. Other substrates may be used in the manufacture of semiconductors, photovoltaics, LCD-TFT, or flat panel devices. Examples of such substrates include, but are not limited to, solid substrates such as metal substrates (for example, Au, Pd, Rh, Ru, W, Al, Ni, Ti, Co, Pt and metal silicides, such as $TiSi_2$, $CoSi_2$, and $NiSi_2$); metal nitride containing substrates (for example, TaN, TiN, WN, TaCN, TiCN, TaSiN, and TiSiN); semiconductor materials (for example, Si, SiGe, GaAs, InP, diamond, GaN, and SiC); insulators (for example, $SiO_2$, $Si_3N_4$, SiON, $HfO_2$, $Ta_2O_5$, $ZrO_2$, $TiO_2$, $Al_2O_3$, and barium strontium titanate); or other substrates that include any number of combinations of these materials. Plastic substrates, such as poly(3,4-ethylenedioxythiophene)poly (styrenesulfonte) [PEDOT:PSS], may also be used. The actual substrate utilized may also depend upon the specific precursor embodiment utilized. In many instances though, the preferred substrate utilized will be selected from TiN, Ru, and Si type substrates.

The vapor of the Lanthanum-containing precursor is introduced into a reactor containing at least one substrate. The temperature and the pressure within the reactor and the temperature of the substrate are held at conditions suitable for vapor deposition of at least part of the Lanthanum-containing precursor onto the substrate. In other words, after introduction of the vaporized precursor into the reactor, conditions within the chamber are such that at least part of the vaporized precursor is deposited onto the substrate to form the Lanthanum-containing film. The reactor may be any enclosure or chamber of a device in which deposition methods take place, such as, without limitation, a parallel-plate type reactor, a cold-wall type reactor, a hot-wall type reactor, a single-wafer reactor, a multi-wafer reactor, or other such types of deposition systems.

The reactor may be maintained at a pressure ranging from about 0.5 mTorr to about 20 Torr. In addition, the temperature within the reactor may range from about 250° C. to about 600° C. One of ordinary skill in the art will recognize that the temperature may be optimized through mere experimentation to achieve the desired result.

The substrate may be heated to a sufficient temperature to obtain the desired Lanthanum-containing film at a sufficient growth rate and with desired physical state and composition. A non-limiting exemplary temperature range to which the substrate may be heated includes from 150° C. to 600° C. Preferably, the temperature of the substrate remains less than or equal to 450° C.

The Lanthanum-containing precursor may be fed in liquid state to a vaporizer where it is vaporized before it is introduced into the reactor. Prior to its vaporization, the Lanthanum-containing precursor may optionally be mixed with one or more solvents, one or more metal sources, and a mixture of one or more solvents and one or more metal sources. The solvents may be selected from the group consisting of toluene, ethyl benzene, xylene, mesitylene, decane, dodecane, octane, hexane, pentane, or others. The resulting concentration may range from approximately 0.05 M to approximately 2 M. The metal source may include any metal precursors now known or later developed.

Alternatively, the Lanthanum-containing precursor may be vaporized by passing a carrier gas into a container containing the Lanthanum-containing precursor or by bubbling the carrier gas into the Lanthanum-containing precursor. Again, the carrier gas may include, but is not limited to, Ar, He, $N_2$, and mixtures thereof. The carrier gas and Lanthanum-containing precursor are then introduced into the reactor. If necessary, the container may be heated to a temperature that permits the Lanthanum-containing precursor to be in its liquid phase and to have a sufficient vapor pressure. The carrier gas may include, but is not limited to, Ar, He, $N_2$, and mixtures thereof. The Lanthanum-containing precursor may optionally be mixed in the container with a solvent, another precursor, or a mixture thereof. The container may be maintained at temperatures in the range of, for example, 0-100° C. Those skilled in the art recognize that the temperature of the container may be adjusted in a known manner to control the amount of Lanthanum-containing precursor vaporized.

In addition to the optional mixing of the Lanthanum-containing precursor with solvents, metal precursors, and stabilizers prior to introduction into the reactor, the Lanthanum-containing precursor may be mixed with reactant species inside the reactor. Exemplary reactant species include, without limitation, $H_2$, metal precursors such as TMA or other aluminum-containing precursors, other Lanthanum-containing precursors, TBTDET, TAT-DMAE, PET, TBTDEN, PEN, and any combination thereof.

When the desired Lanthanum-containing film also contains oxygen, such as, for example and without limitation, lanthanum oxide, the reactant species may include an oxygen source which is selected from, but not limited to, $O_2$, $O_3$, $H_2O$, $H_2O_2$, acetic acid, formalin, para-formaldehyde, and combinations thereof.

When the desired Lanthanum-containing film also contains nitrogen, such as, for example and without limitation, lanthanum nitride or lanthanum carbo-nitride, the reactant species may include a nitrogen source which is selected from, but not limited to, nitrogen ($N_2$), ammonia and alkyl derivatives thereof, hydrazine and alkyl derivatives thereof, N-containing radicals (for instance N., NH., $NH_2$.), NO, $N_2O$, $NO_2$, amines, and any combination thereof.

When the desired Lanthanum-containing film also contains carbon, such as, for example and without limitation, Lanthanum carbide or Lanthanum carbo-nitride, the reactant species may include a carbon source which is selected from, but not limited to, methane, ethane, propane, butane, ethylene, propylene, t-butylene, isobutylene, $CCl_4$, and any combination thereof.

When the desired Lanthanum-containing film also contains silicon, such as, for example and without limitation, Lanthanum silicide, Lanthanum silico-nitride, Lanthanum silicate, Lanthanum silico-carbo-nitride, the reactant species may include a silicon source which is selected from, but not limited to, $SiH_4$, $Si_2H_6$, $Si_3H_8$, TriDMAS, BDMAS, BDEAS, TDEAS, TDMAS, TEMAS, $(SiH_3)_3N$, $(SiH_3)_2O$, trisilylamine, disiloxane, trisilylamine, disilane, trisilane, an alkoxysilane $SiH_x(OR^1)_{4-x}$, a silanol $Si(OH)_x(OR^1)_{4-x}$ (preferably $Si(OH)(OR^1)_3$; more preferably $Si(OH)(OtBu)_3$, an aminosilane $SiH_x(NR^1R^2)_{4-x}$ (where x is 1, 2, 3, or 4; $R^1$ and $R^2$ are independently H or a linear, branched or cyclic C1-C6 carbon chain; preferably TriDMAS, BTBAS, and/or BDEAS), and any combination thereof. The targeted film may alternatively contain Germanium (Ge), in which case the above-mentioned Si-containing reactant species could be replaced by Ge-containing reactant species.

When the desired Lanthanum-containing film also contains another element, such as, for example and without limitation, Ge, Ti, Ta, Hf, Zr, Nb, Mg, Al, Sr, Y, Ba, Ca, As, Sb, Bi, Sn, Pb, or combinations thereof, the reactant species may include a precursor which is selected from, but not limited to, alkyls such as $SbR^{i''}_3$ or $SnR^{i''}_4$ (wherein each $R^{i''}$ is independently H or a linear, branched, or cyclic C1-C6 carbon chain), alkoxides such as $Sb(OR^i)_3$ or $Sn(OR^i)_4$ (where each $R^i$ is independently H or a linear, branched, or cyclic C1-C6 carbon chain), and amines such as $Sb(NR^1R^2)(NR^3R^4)(NR^5R^6)$ or $Ge(NR^1R^2)(NR^3R^4)(NR^5R^6)(NR^7R^8)$ (where each $R^1$, $R^2$, $R^3$, $R^4$, $R^5$, $R^6$, $R^7$, and $R^8$ is independently H, a C1-C6 carbon chain, or a trialkylsilyl group, the carbon chain and trialkylsilyl group each being linear, branched, or cyclic), and any combination thereof.

The Lanthanum-containing precursor and one or more reactant species may be introduced into the reactor simultaneously (chemical vapor deposition), sequentially (atomic layer deposition), or in other combinations. For example, the Lanthanum-containing precursor may be introduced in one pulse and two additional metal sources may be introduced together in a separate pulse [modified atomic layer deposition]. Alternatively, the reactor may already contain the reactant species prior to introduction of the Lanthanum-containing precursor. The reactant species may be passed through a plasma system localized remotely from the reactor, and decomposed to radicals. Alternatively, the Lanthanum-containing precursor may be introduced to the reactor continuously while other reactant species are introduced by pulse (pulsed-chemical vapor deposition). In each example, a pulse may be followed by a purge or evacuation step to remove excess amounts of the component introduced. In each example, the pulse may last for a time period ranging from about 0.01 s to about 10 s, alternatively from about 0.3 s to about 3 s, alternatively from about 0.5 s to about 2 s.

In one non-limiting exemplary atomic layer deposition type process, the vapor phase of a Lanthanum-containing precursor is introduced into the reactor, where at least part of the Lanthanum-containing precursor reacts with a suitable substrate in a self-limiting manner. Excess Lanthanum-containing precursor may then be removed from the reactor by purging and/or evacuating the reactor. An oxygen source, such as ozone, is introduced into the reactor where it reacts with the absorbed Lanthanum precursor. Any excess oxygen source is removed from the reactor by purging and/or evacuating the reactor. If the desired film is a Lanthanum oxide film, this two-step process may provide the desired film thickness or may be repeated until a film having the necessary thickness has been obtained.

LaGeO$_x$, wherein x is a number ranging from 1 to 5 inclusive, may spontaneously form when the ALD LaO film is deposited on a Ge or GeO$_2$ substrate. The LaGeO$_x$ film may serve as a channel material in metal oxide semiconductor (MOS) devices due to high hole mobility and low dopant activation temperatures.

Alternatively, the LaO$_x$ film may be deposited as a capping layer on a HfO$_x$ or ZrO$_x$ high k gate dielectric film, with x being a number ranging from 1 to 5 inclusive. The LaO$_x$ capping layer reduces Fermi level pinning effects between the gate dielectric layer and a metal gate.

In another alternative, if the desired film is a Lanthanum oxide film containing another element, the two-step process above may be followed by introduction of the vapor of a precursor into the reactor. The precursor will be selected based on the nature of the Lanthanum metal oxide film being deposited and may include a different Lanthanum-containing precursor. After introduction into the reactor, the precursor is contacted with the substrate. Any excess precursor is removed from the reactor by purging and/or evacuating the reactor. Once again, an oxygen source may be introduced into the reactor to react with the precursor. Excess oxygen source is removed from the reactor by purging and/or evacuating the reactor. If a desired film thickness has been achieved, the process may be terminated. However, if a thicker film is desired, the entire four-step process may be repeated. By alternating the provision of the Lanthanum-containing precursor, precursor, and oxygen source, a film of desired composition and thickness can be deposited.

The Lanthanum-containing films or Lanthanum-containing layers resulting from the processes discussed above may include La$_2$O$_3$, (LaLn)O$_3$, La$_2$O$_3$-Ln$_2$O$_3$, LaSi$_x$O$_y$, LaGe$_x$O$_y$, (Al, Ga, Mn)LnO$_3$, HfLaO$_x$ or ZrLaO$_x$, LaSrCoO$_4$, LaSrMnO$_4$ where Ln is a different Lanthanide and x is 1 to 5 inclusive. Preferably, the Lanthanum-containing film may include HfLaO$_x$ or ZrLaO$_x$. One of ordinary skill in the art will recognize that by judicial selection of the appropriate Lanthanum-containing precursor and reactant species, the desired film composition may be obtained.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the lanthanum-containing film may be exposed to a temperature ranging from approximately 200° C. and approximately 1000° C. for a time ranging from approximately 0.1 second to approximately 7200 seconds under an inert atmosphere, a H-containing atmosphere, a N-containing atmosphere, an 0-containing atmosphere, or combinations thereof. Most preferably, the temperature is 350° C. for 1800 seconds under an inert atmosphere of Argon. The resulting film may contain fewer impurities and therefore may have an improved density resulting in improved leakage current. The annealing step may be performed in the same reactor in which the deposition process is performed. Alternatively, the substrate may be removed from the reactor, with the annealing/flash annealing process being performed in a separate apparatus. Any of the above post-treatment methods, but especially thermal annealing, has been found effective to reduce carbon and nitrogen contamination of the Lanthanum-containing film. This in turn tends to improve the leakage current and the interface trap density (D$_{it}$) of the film.

EXAMPLES

The following non-limiting examples are provided to further illustrate embodiments of the invention. However, the examples are not intended to be all inclusive and are not intended to limit the scope of the inventions described herein.

Example 1

La(iPrCp)$_2$(N$^{iPr}$-amd)

Step 1: A 200 mL Schlenk flask was charged with LaCl$_3$ (5.0 g, 20.38 mmol) and 20 mL anhydrous THF. The mixture was stirred at Room Temperature (RT) for 5 hours to form a white LaCl$_3$.THF$_x$ suspension, with x being 1 to 5. In a separate 100 mL Schlenk flask, Na(iPrCp) (5.31 g, 40.77 mmol) was dissolved in 20 mL anhydrous THF to produce a dark pink solution. The Na(iPrCp) solution was added dropwise to the LaCl$_3$.THF$_x$ suspension at RT. The resulting yellow, cloudy mixture was stirred overnight at RT to give a brown mixture.

Step 2: A 100 mL Schlenk flask was charged with iPr—N=C=N-iPr (2.57 g, 20.38 mmol) followed by 20 mL of anhydrous THF. To the iPr—N=C=N-iPr solution in a dry ice bath was added dropwise 12.73 mL of MeLi (1.6 M in diethyl ether). The resulting colorless solution was brought to RT and stirred for 3 hrs.

The flask contents of Step 2 were transferred to step 1's flask by a cannula at −78° C. The mixture was stirred overnight to become orange solution. The solvent was evaporated by vacuum. Pentane was inefficient to extract the material. Toluene was added instead and the mixture was stirred at RT. Toluene and pentane are commonly used laboratory solvents. However, pentane was not effective at extracting the lanthanum product, whereas toluene was, even though pentane was successfully used for similar compounds in the lanthanide series (see, e.g., synthesis of Y(iPrCp)$_2$(N$^{iPr}$-amd) in Example 2, synthesis of Er(RCp)$_2$(N$^R$-amd or N$^R$-fmd) in Examples 3-7, and synthesis of Yb(MeCp)$_2$(N$^R$-amd) in Examples 8 and 9 of WO2009/149372). To our knowledge, the different behaviors of these two solvents are not documented in any scientific literature because of the low volume usage of lanthanum and lanthanide materials and the novelty of the reaction products. The stirring was stopped and the precipitate settled down to give a yellowish precipitate and a brownish toluene solution. The brownish solution was filtered over dry celite and the toluene was evaporated by vacuum. The resulting brown oil was transferred to a 10 mL flask with a 14/20 joint. A distillation head and a receiver were installed onto the flask. Trace of solvents and volatiles were evaporated under vacuum at 50° C. The resulting uncolored oil was vacuum distilled at 175° C. at 35 mTorr with head temperature 128° C. Yield is 3.6 g (36%). The NMR spectra is provided in FIG. 1.

Figure 2:
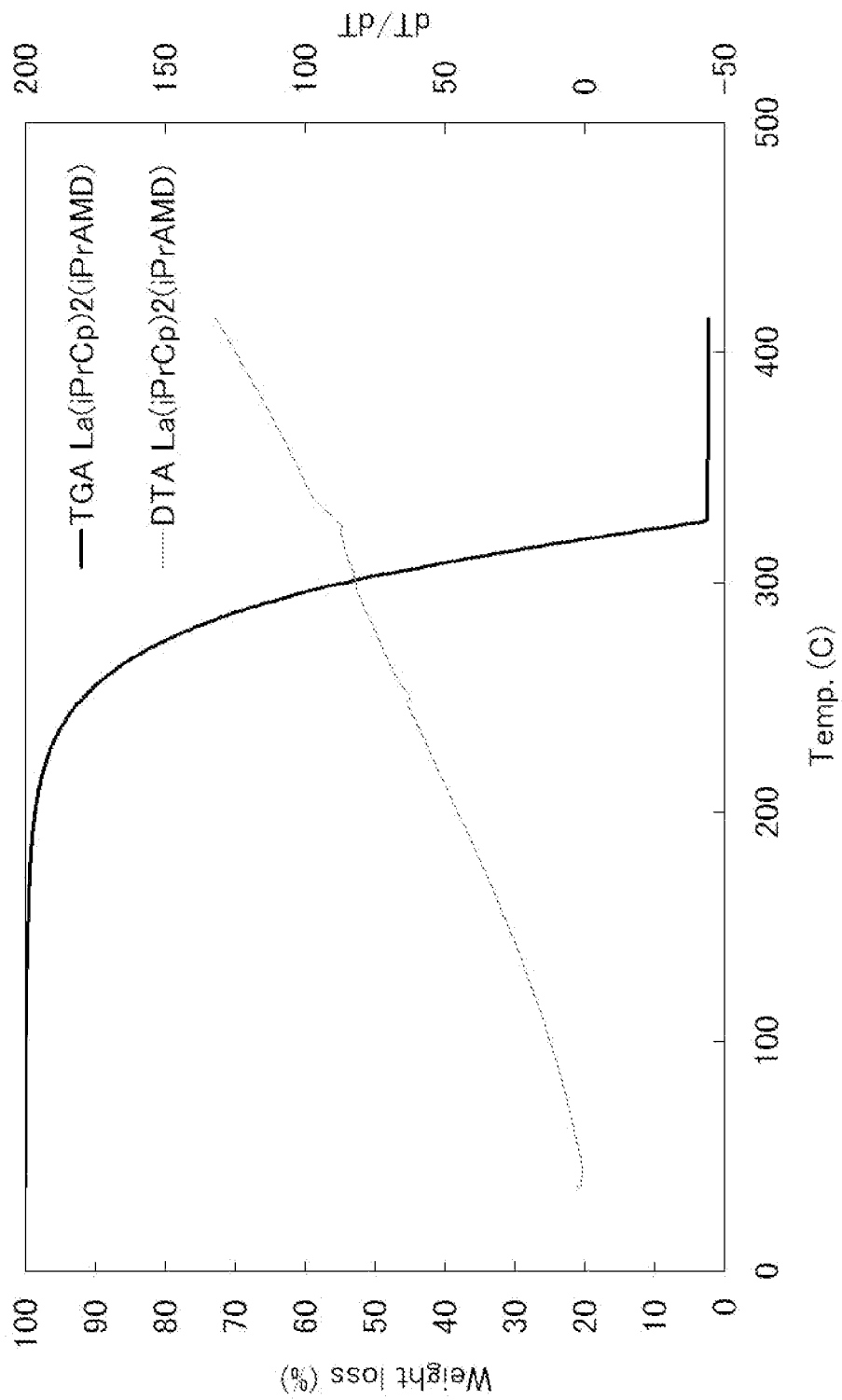
FIG. 2 is a ThermoGravimetric Analysis/Differential Thermal Analysis (TGA/DTA) graph demonstrating the percentage of weight loss with temperature change of $La(iPrCp)_2(N^{iPr}\text{-amd})$ and the difference in temperature between the $La(iPrCp)_2(N^{iPr}\text{-amd})$ sample and a reference when exposed to the same heating source, which illustrates phase change of the $La(iPrCp)_2(N^{iPr}\text{-amd})$ sample.

The colorless oil left a <2% residual mass during TGA analysis measured at a temperature rising rate of 10° C./min in an atmosphere which flows nitrogen at 220 mL/min. These results are depicted in FIG. 2, which is a TGA graph demonstrating the percentage of weight loss with temperature change.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A composition comprising a Lanthanum-containing precursor of the general formula:

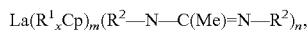

wherein:
- $R^1$ is selected from the group consisting of H and a C1-C5 alkyl chain;
- $R^2$ is selected from the group consisting of H and a C1-C5 alkyl chain;
- x is 0-5;
- n and m range from 1 to 2; and
- the precursor has a melting point below approximately 105° C.

2. The composition of claim 1, wherein $R^1$ is selected from the group consisting of Me, Et, and iPr.

3. The composition of claim 1, wherein $R^2$ is selected from the group consisting of iPr and tBu.

4. The composition of claim 1, wherein m is 2 and n is 1.

5. The composition of claim 1, wherein the Lanthanum-containing precursor is La(iPrCp)$_2$(iPr—N—C(Me)=N-iPr).

6. A method of forming a Lanthanum-containing film on a substrate, the method comprising the steps of:
- introducing the Lanthanum-containing precursor of claim 1 into a reactor having a substrate disposed therein; and
- depositing at least part of the Lanthanum-containing precursor onto the substrate to form the Lanthanum-containing film on the substrate using a vapor deposition process.

7. The method of claim 6, further comprising introducing a reactant species into the reactor.

8. The method of claim 7, wherein the reactant species is selected from the group consisting of $O_2$, $O_3$, $H_2O$, $H_2O_2$, acetic acid, formalin, para-formaldehyde, and combinations thereof.

9. The method of claim 8, wherein the reactant species is ozone.

10. The method of claim 9, wherein the Lanthanum-containing precursor is La(iPrCp)$_2$(iPr—N—C(Me)=N-iPr).

11. The method of claim 10, wherein the deposition process is an atomic layer deposition process.

12. The method of claim 8, wherein the Lanthanum-containing film is selected from the group consisting of $La_2O_3$, (LaLn)$O_3$, $La_2O_3$-$Ln_2O_3$, LaSi$_x$O$_y$, LaGe$_x$O$_y$, (Al, Ga, Mn)LnO$_3$, HfLaO$_x$, ZrLaO$_x$, LaSrCoO$_4$, and LaSrMnO$_4$, where Ln is a different Lanthanide and x and y are each independently selected from a number ranging from 1 to 5 inclusive.

13. The method of claim 6, wherein the Lanthanum-containing precursor is La(iPrCp)$_2$(iPr—N—C(Me)=N-iPr).

14. The method of claim 6, further comprising introducing a precursor into the reactor, wherein the precursor is different from the Lanthanum-containing precursor, and depositing at least part of the precursor to form the Lanthanum-containing film on the substrate.

15. The method of claim 14, wherein the precursor contains an element selected from the group consisting of Hf, Si, Al, Ga, Mn, Ti, Ta, Bi, Zr, Pb, Nb, Mg, Sr, Y, Ba, Ca, a Lanthanide, and combinations thereof.

16. The method of claim 6, wherein the deposition process is a chemical vapor deposition process.

17. The method of claim 6, wherein the deposition process is an atomic layer deposition process.

* * * * *